(12) United States Patent
Pereira et al.

(10) Patent No.: US 8,946,856 B2
(45) Date of Patent: Feb. 3, 2015

(54) DECOUPLING CAPACITORS FOR INTEGRATED CIRCUITS

(71) Applicant: Silicon Laboratories Inc., Austin, TX (US)

(72) Inventors: Vitor M. Pereira, Austin, TX (US); Trent O. Dudley, Peckville, PA (US); Jessica P. Davis, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/664,007

(22) Filed: Oct. 30, 2012

(65) Prior Publication Data

US 2014/0117497 A1    May 1, 2014

(51) Int. Cl.
*H01L 21/02*    (2006.01)

(52) U.S. Cl.
USPC ............................ 257/532; 716/115; 438/395

(58) Field of Classification Search
CPC .................................................. H01L 27/0805
USPC .......................................... 257/532; 716/115
See application file for complete search history.

(56) References Cited

U.S. PATENT DOCUMENTS

| | | | |
|---|---|---|---|
| 5,266,821 A | | 11/1993 | Chern et al. |
| 6,395,591 B1 * | | 5/2002 | McCormack et al. ........ 438/199 |
| 6,487,702 B2 | | 11/2002 | Lin et al. |
| 2005/0122755 A1 * | | 6/2005 | Tsutsumi et al. ............... 365/51 |
| 2005/0276132 A1 * | | 12/2005 | Severson et al. ............. 365/202 |
| 2007/0045770 A1 * | | 3/2007 | Aoki .............................. 257/516 |
| 2007/0252217 A1 * | | 11/2007 | Oki ............................... 257/369 |
| 2007/0274059 A1 * | | 11/2007 | (Chennupati)Raghuram 361/818 |
| 2009/0007032 A1 * | | 1/2009 | Kariat et al. ...................... 716/4 |

OTHER PUBLICATIONS

Su et al., "Optimal Decoupling Capacitor Sizing and Placement for Standard Cell Layout Designs", NSF and SRC, Apr. 2003, 27 pgs.
Popovich et al., "Efficient Placement of Distributed On-Chip Decoupling Capacitors in Nanoscale ICs", IEEE, 2007, 6 pgs.

* cited by examiner

*Primary Examiner* — Fernando L Toledo
*Assistant Examiner* — Victoria K Hall
(74) *Attorney, Agent, or Firm* — Egan, Peterman & Enders LLP (57) ABSTRACT

On-chip decoupling capacitors and methods for placing the same are disclosed in which designated spaces are created between the active circuits to insert designated capacitor cells. The designated capacitor cells may be placed in designated areas of the integrated circuit that are not simply spaces left empty by cell placement or frontier areas in or around the route, and the dimensions (e.g., height) of the designated capacitor cells may be selected to optimize (increase) capacitance efficiency. The capacitor cells may also be placed to target and reduce the interference between a digital core (aggressor) circuit and a victim analog circuit.

22 Claims, 6 Drawing Sheets

DECOUPLING CAPACITORS FOR INTEGRATED CIRCUITS

FIELD OF THE INVENTION

This disclosure generally relates to integrated circuits, and more particularly to placement of decoupling capacitors for integrated circuits.

BACKGROUND OF THE INVENTION

De-coupling capacitors have been employed for integrated circuits to reduce transient voltage and currents, and to manage loop currents and digital supply ripple that occur during integrated circuit chip operation. On-chip decoupling capacitors have been placed in the unused boundary areas of an integrated circuit, outside the active circuitry (outside the digital core) of the integrated circuit, in the spaces left empty by cell placement or frontier areas in or around the route. In the past, the amount of decoupling capacitors needed in the digital route to manage loop currents and digital supply ripple has defined the final digital cores size in spur-sensitive integrated circuits. This is mainly due to the low efficiency of the available decoupling cells and the need to have considerable in-route capacitance. This causes the maximum digital route utilization to be determined not by the routability of the core but by the amount of in-route cap needed.

SUMMARY OF THE INVENTION

Disclosed herein are integrated circuits that employ on-chip decoupling capacitors and methods for placing the same in which designated spaces are created between the active circuits to insert designated capacitor cells. In one embodiment, such designated capacitor cells may be placed in designated areas within the digital core of an integrated circuit that are not simply spaces left empty by cell placement or frontier areas in or around the route. In another embodiment, the dimensions (e.g., height) of the designated capacitor cells may be selected to optimize (increase) capacitance efficiency. In yet another embodiment, the placement of the capacitor cells may be selected to target and reduce the interference between a digital core (aggressor) circuit and an analog circuit (victim). In this regard, capacitor cells may be placed so as to increase the quantity of decoupling capacitance per area in the digital route and to optimize its placement so as to reduce the coupling from the digital circuits to the analog circuits in an integrated circuit, e.g., by placing decoupling capacitors adjacent or otherwise near to current perturbation source/s so as to reduce the size and effects of current loops.

In one exemplary configuration, designated capacitor cells may be rows (and/or columns) that are placed to specifically target the interference between digital core (aggressor) circuitry and an analog circuit (victim), and not based on fan-out or signal integrity concerns. In another exemplary configuration, one or more decoupling capacitors may be formed to substantially fully occupy the space across a cell row, e.g., such as across a cell row defined by a single MOS-type cell (PMOS or NMOS) between power supply rails. In yet another exemplary embodiment, designated capacitor cells may be placed in areas within the outer boundary of a digital core so as to minimize of or substantially eliminate current loop and other coupling interference imparted to analog circuitry that is placed to at least partially surround the outer boundary of the digital core.

The disclosed circuits may be implemented using a cell topology and placement strategy that may employ one or more of the following features. First, utilization may be forced to be as high as possible while still allowing the core to be routed. If desired, common decoupling cells may be still used where possible as fillers. Second, a single MOS-type cell (PMOS or NMOS) may be created, and the dimensions of the transistor/s in this cell may be configured to increase area efficiency of a decoupling cell subject to the quality factor needed for each specific application. In this regard, area efficiency of a decoupling cell may be defined as: (capacitor area/total cell area)×100.

Well/substrate biasing considerations and non-obstructing layout may also be considered. In one exemplary embodiment, this approach may be employed to enable the area efficiency of the single cell to be greater than 30% and in one embodiment to be as high as about 80%. This is in contrast to conventional cell rows that are used to create common CMOS decoupling capacitor cells containing both nWells and pWells, and which have an area efficiency as low as 15% or less. In this regard, such a conventional CMOS common cell needs to contain both nWell and pWell so that it can be abutted to the adjacent standard cells without further waste of space. The existence of the two wells forces the decoupling capacitors to be both NOMS and PMOS. This type of decoupling cell is limited by several spacing design rules (e.g., such as Implant over Active area overlap; nWell overlap of P+ Active area and Space to N+ Active Area; and Poly space to Active area) which forces considerable space to be wasted in the distance between structures. More particularly, the tallest common capacitor decoupling cells typically have a highest area efficiency of 30%, although such taller cells often cannot be used in the layout of conventional decoupling capacitor approaches. Smaller height conventional cells typically have an area efficiency of 15% or less.

In one embodiment, the height of a single MOS-type decoupling cell row may be configured to be an even multiple of the standard cell row height in order to allow capacitors of the decoupling cell row to easily connect to the same supply rail (positive or negative) on both sides of the decoupling cell row. In such a case, this configuration allows direct biasing of the single well in the cell and makes the interface to the upper and lower rows of cells direct, e.g., with substantially no waste of space. The access to the supply of polarity opposite to the polarity that biases the well may be accomplished in one exemplary embodiment by directly tapping a supply mesh constructed over the circuit. Third, decoupling capacitors may be placed in rows that occupy the full height of the placement and routing core, e.g., such that substantially no space is wasted to meet minimum distance design rules to wells in horizontally-adjacent standard cells. Further, multiple decoupling capacitor cells in the same decoupling cell row may be tiled side by side so as to all have the same height.

In one embodiment of the disclosed circuits and methods, decoupling cell rows may be configured to be equidistant in a digital circuit core with homogeneous/balanced power consumption, or the distance between decoupling cell rows may be chosen (e.g., varied) according to the spatial current distribution in order to reduce both the area of higher-current loops and the local supply ripple. The decoupling cell rows may also be configured in a way that takes into account the frequency components of interest in the supply current as well as the distance to the victim circuit.

The following hypothetical example illustrates how integrated circuit routing and capacitor efficiency may be optimized using the disclosed circuits and placement methods. A conventional integrated circuit design which originally required utilization to be restricted to 80% to provide a given amount of capacitance using common CMOS decoupling cells with 24.5% efficiency, may be re-implemented in one exemplary embodiment to achieve a routability-limited utilization of about 92%, with excess circuit area being occupied by rows of high-efficiency single MOS-type decoupling cells. In this regard, if all of the excess circuit area is retained, the total decoupling capacitance may be further increased by a factor of about 2.35. Alternatively, most of the excess circuit area may be removed from a given integrated circuit, and a smaller amount of high-efficiency single MOS-type decoupling cells and associated circuit area may be employed than is required using conventional CMOS capacitor and placement methodology while at the same time providing the a substantially equivalent amount of capacitance, thus reducing the cost of the integrated circuit.

In one respect, disclosed is an integrated circuit device, including: a silicon substrate; analog circuitry formed on the silicon substrate; a digital core formed on the silicon substrate separate from the analog circuitry, the digital core including at least one area of active digital circuitry; one or more decoupling cell rows formed on the substrate within the area of active digital circuitry, each of the given decoupling cell rows including at least one p-type doped well or a n-type doped well extending across an entire height of the decoupling cell row; and one or more metal-oxide-semiconductor (MOS) decoupling capacitors formed within the at least one p-type doped well or n-type doped well of each of the decoupling cell rows.

In another respect, disclosed herein is a method for configuring an integrated circuit device, including: providing a silicon substrate; forming analog circuitry on the silicon substrate; forming a digital core on the silicon substrate separate from the analog circuitry, the digital core including at least one area of active digital circuitry; forming one or more decoupling cell rows on the substrate within the area of active digital circuitry, each of the given decoupling cell rows including only one of a p-type doped well or a n-type doped well extending across an entire height of the decoupling cell row; and forming one or more metal-oxide-semiconductor (MOS) decoupling capacitors in the p-type doped well or n-type doped well of each of the decoupling cell rows.

DESCRIPTION OF ILLUSTRATIVE EMBODIMENTS

Figure 1A:
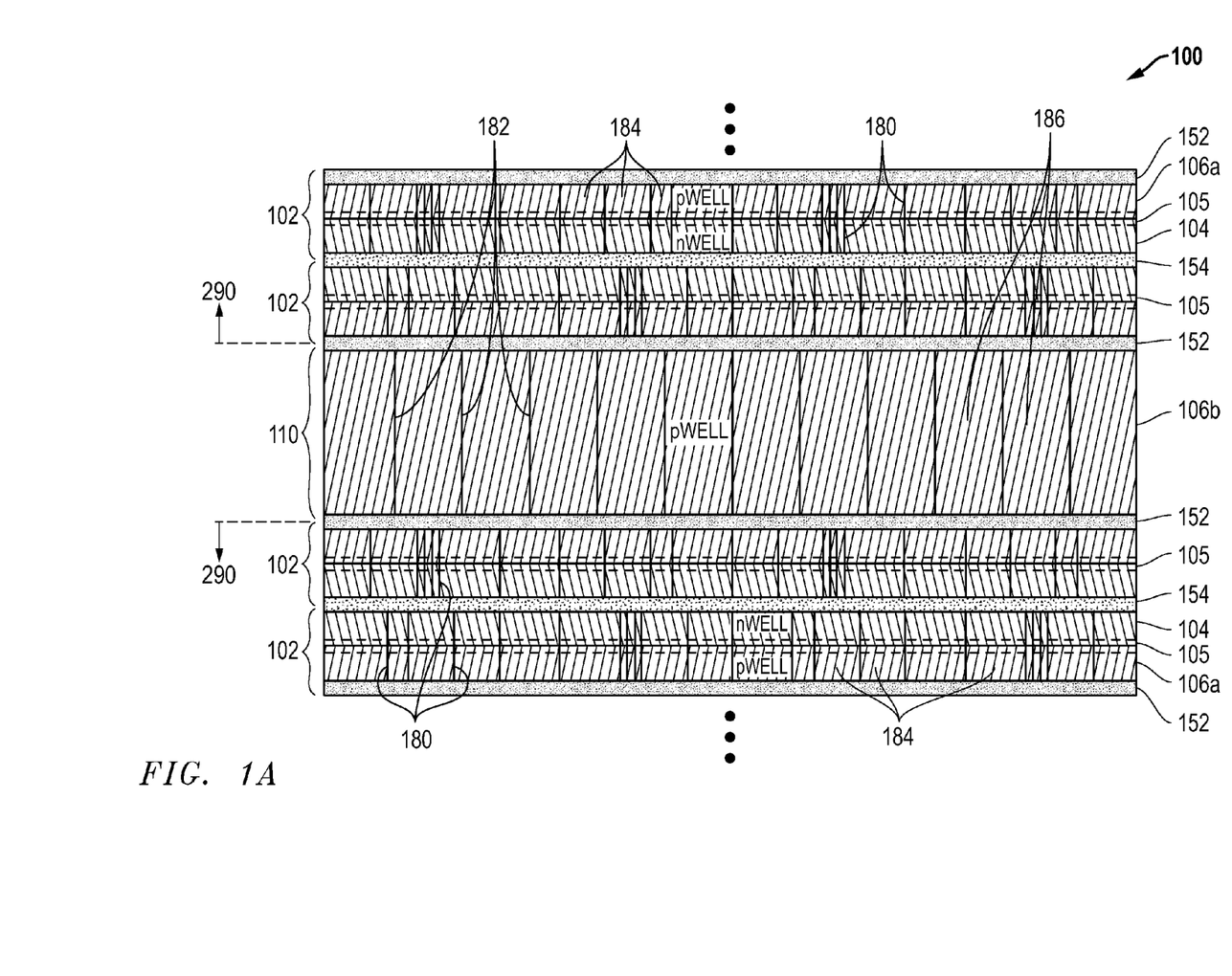
FIG. 1A illustrates an overhead view of a portion of an integrated circuit according to one exemplary embodiment of the disclosed circuits and methods.

FIG. 1A illustrates an overhead view of a portion of an integrated circuit (IC) 100 configured according to one exemplary embodiment. In this embodiment, IC circuit 100 may be a silicon substrate having standard complementary metal-oxide-semiconductor (CMOS) cell rows 102 and a NMOS decoupling row 110 defined thereon between a pair of standard cell rows 102. As illustrated in FIG. 1A, a decoupling row 110 may be configured to have a height (i.e. the vertical distance in FIG. 1A between the adjacent supply rails 152 on either side of decoupling row 110) that is substantially twice the height of the standard cell rows 102 (i.e. the vertical distance in FIG. 1A between the adjacent supply rails 152 and 154 on either side of each standard cell row 110), although a decoupling row 110 may alternatively be configured to have a height that is greater than twice the height of standard cell rows 102 or less than twice the height of standard cell rows 102. Separating and delineating the standard cell rows 102 and decoupling row 110 are positive supply rails 154 and negative supply rails 152 that may be overlying parallel-oriented metallization layers that supply power using interconnects (e.g., vias) to the underlying active circuitry of IC 100. The underlying active circuitry may be defined underneath and between the adjacent overlying supply rails.

Figure 2:
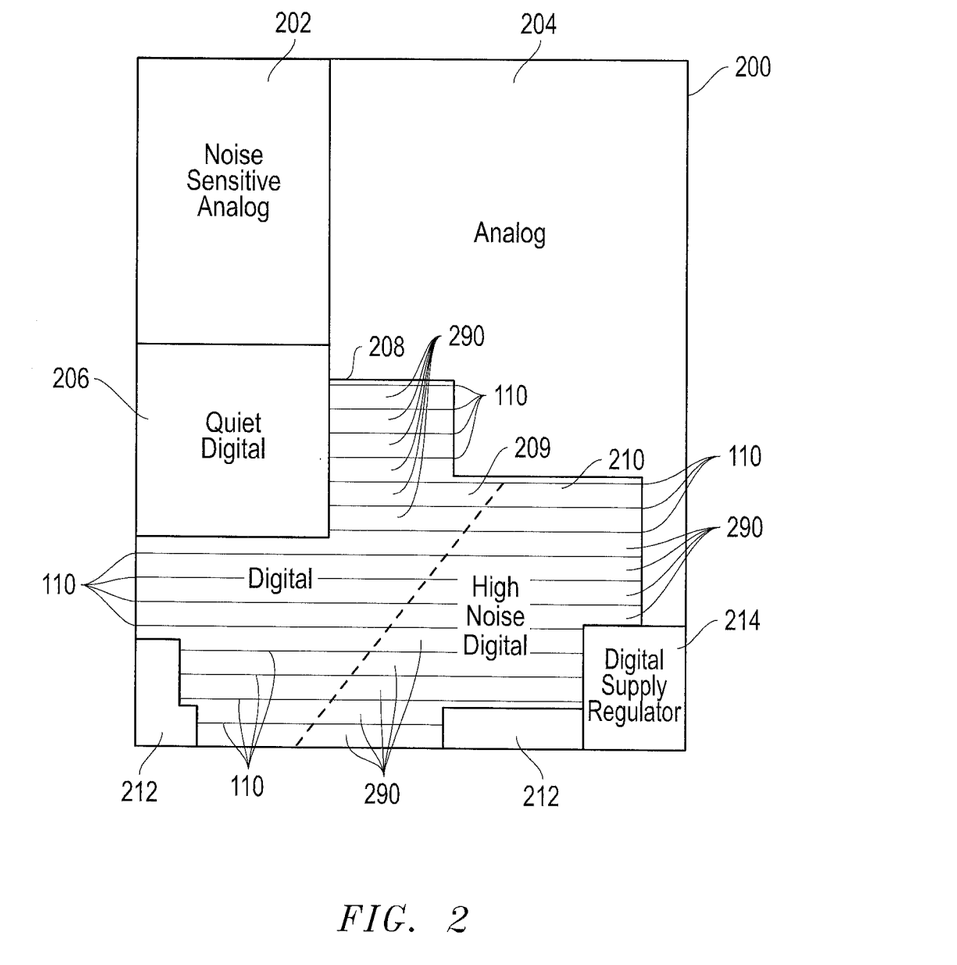
FIG. 2 illustrates an overhead view of an integrated circuit according to one exemplary embodiment of the disclosed circuits and methods.

In the exemplary embodiment of FIG. 1A, standard cell rows 102 may be used to form circuitry of digital logic rows 290 of IC 200 of FIG. 2, although it is alternatively possible that a decoupling row 110 may be provided between standard cell rows 102 that are empty and/or that are used to form decoupling capacitors. It is also possible that a decoupling row 110 may be defined adjacent the edge of digital circuitry, i.e., digital logic rows 290 on one side and empty standard cell rows 102 on the other side. In FIG. 1A, the illustrated lines 180 represent frontier areas between individual standard logic cells 184 in standard cell rows 102, and the illustrated lines 182 represent frontier areas between individual decoupling capacitor cells 186 in decoupling row 110. As shown, the width of individual standard logic cells 184 (i.e., the horizontal distance in FIG. 1A between adjacent frontier area lines 180) may vary in this embodiment due to circuitry design, whereas all of the individual decoupling capacitor cells 186 may be configured to have the same standardized width (i.e., the horizontal distance in FIG. 1A between adjacent frontier area lines 182) which may be, for example, the largest cell width (or transistor size) that results in a satisfactory capacitor quality factor for the decoupling capacitors. As shown, decoupling capacitor cells 186 of this optimized width may be disposed as tiles of substantially the same size across the width of decoupling row 110, although it may sometimes be desirable to place narrower decoupling cells at the opposing terminal ends of a decoupling row 110.

As further shown in FIG. 1A, each of standard CMOS cell rows 102 is defined between a positive supply rail 154 and an adjacent corresponding negative supply rail 152 having a given standard spacing, and a designated NMOS decoupling row 110 is defined between two adjacent negative supply rails 152 having a spacing that is taller than this given standard spacing. In one exemplary embodiment, the taller supply rail spacing of a decoupling row 110 may be selected to be an even multiple (e.g., 2×, 4×, 6×, etc.) of the narrower spacing of the standard cell rows 102 such that the decoupling row 110 may be will be defined between supply rails of like polarity (negative or positive) for coupling on opposing sides of the decoupling row 110 when it is fit into a pattern of standard cell rows 102 as shown. As an example, in one exemplary embodiment, the standard spacing height between supply rails 152 and 154 of each standard cell row 102 may be about 1.8 µm, and the taller spacing height between adjacent negative supply rails 152 of decoupling cell row 110 may be about 10.8 µm (or 6× spacing), although other greater and lesser heights and spacings may be alternatively employed.

Underlying the power supply rails 152 and 154 are respective alternating and parallel-oriented pWell row regions 106a, 106b (silicon substrate doped with P-type dopant such as Boron) and nWell row regions 104 (silicon substrate doped with N-type dopant material such as Phosphorous, Arsenic or Antimony) that are formed in CMOS fashion in the substrate of IC 100 in a manner that coincides with the overlying supply rails 152 and 154. In this regard, each standard CMOS cell row 102 includes a portion of a pWell region 106a, 106b and a portion of an adjacent nWell region 104, with a negative supply rail 152 overlying each pWell region 106a, 106b and a positive supply rail 154 overlying each nWell region 104. Also as shown, within the standard cell rows 102 MOS devices formed in each nWell region 104 are separated from each pWell region by a spacing 105, for example, a spacing defined according to spacing rules that require that p+ transistors have a certain minimum enclosure by nWell and that adjacent n+ transistors have a certain minimum spacing from the adjacent abutting nWell. It will be understood that these requirements vary depending on the rules dictated by particular process requirements FIG. 1A also shows NMOS decoupling row 110 that is defined to include a single pWell region 106b that is taller than the adjacent nWell regions 104 and pWell regions 106a of the standard CMOS cells 102. As shown, the taller pWell region 106b of decoupling row 110 may be configured with a height that is sufficient to extend beyond the negative supply rails 152 that mark the outer boundary of the decoupling row 110 so as to also fatal a part of the adjacent standard cell rows 102 formed on either side of decoupling row 110. In this regard, height of each pWell region 106a may vary in corresponding fashion with height of a given decoupling row 110. It will be understood that the illustrated polarity of FIG. 1A is exemplary only, and that a decoupling row for an IC may be laid out with a reversed polarity but in otherwise similar fashion to FIG. 1A, i.e., a decoupling row 110 may be alternatively formed as a PMOS decoupling row that includes a single wide nWell region that is taller than alternating adjacent pWell regions and nWell regions of the standard CMOS cell rows 102 that surround the decoupling row 110.

FIG. 2 illustrates an overhead view of an IC 200 configured according to one exemplary embodiment, showing a breakdown of the digital core 208 and decoupling rows 110 defined therein. In this embodiment, IC 200 includes digital logic active circuitry areas 206, 209 and 210 within the outer boundary of digital core 208, analog circuitry areas 202 and 204 at least partially surrounding the outer boundary of digital core 208, digital supply regulator circuitry 214, and input/output (I/O) PAD circuit areas 212 that are in this case located at the frontier or edge of the digital circuitry areas 209 and 210 outside the outer boundary of the digital core 208 of IC 200. As shown, the circuitry areas of IC 200 may be optionally laid out in order to increase (e.g., maximize) the distance between noisier circuitry (aggressor circuitry) and noise sensitive circuitry (victim circuitry). In the specific example of FIG. 2, noise-sensitive analog circuitry 202 is placed near one corner of IC 200 and high noise digital circuitry 210 and digital supply regulator circuitry 214 are placed near an opposing corner of IC 200, with other analog circuitry 204, quiet digital circuitry 206 and intermediate noise digital circuitry 209 placed therebetween such that the quietest circuitry areas are placed nearest the most noise sensitive circuitry as shown.

Following are example types of circuitry areas that may be present in an IC embodiment such as illustrated FIG. 2, it being understood that other examples of such analog and/or digital circuitry may be present in an IC, and/or that other combinations of analog and/or digital circuitry may be present in an IC. Noise-sensitive analog circuitry 202 may be, for example, RF frontend circuitry containing as an example low noise amplifier (LNA) and mixer circuitry. Other analog circuitry 204 may be, for example, Analog—intermediate frequency (IF) circuitry, digital to analog conversion circuitry (DACs), and/or analog to digital conversion circuitry (ADCs). Quiet digital circuitry 206 may be, for example, circuitry used only when the noise level is not critical, e.g., as when the IC 200 is powering up, e.g., non-volatile memory (NVM) and part, of read-only memory (ROM). High noise digital circuitry 210 may be, for example, digital signal processor (DSP) logic with high signal dependent content. It will also be understood that absolute noise level is only one factor that may be considered when determining relative placement and noise type of different types of analog and digital circuitry. For example, RF frontend circuitry may be considered more sensitive because it operates with a lower signal level then the reminder of the circuitry chain, but frequency content may also be considered when determining placement of each type of circuitry. Thus, circuitry 210 may be categorized as "high noise digital" not only due to its operating signal level, but also because the perturbation it creates is in a frequency band that will disturb the sensible analog circuitry 202. In this regard, the frequency band of interest will depend on the individual application.

As further shown in FIG. 2, decoupling rows 110 are placed within at least a portion of the digital core 208 of IC 200, and specifically within digital circuitry areas 209 and 210 between active circuitry formed in standard cell rows 102 (not shown in FIG. 2) in order to reduce and/or substantially eliminate noise interference caused by the digital circuitry areas 209 and 210. It will be understood that the particular spacing between adjacent decoupling rows 110 may be selected and/or varied to fit the particular noise or current density characteristics of the active digital circuitry within digital core 208, and/or the amount of noise suppression that is desired for a given application. For example, decoupling rows 110 may be evenly spaced in those areas where current density across the digital core is substantially homogeneous, or decoupling row spacing may vary across the digital core 208 to correspond to changing current densities across the digital core 208, e.g. adjacent decoupling rows 110 may be spaced closer together in those areas of the digital core 208 having relatively higher current density and decoupling rows 110 may be spaced farther apart in those areas of the digital core 208 having relatively lower current density. Although no decoupling rows 110 are shown present within quiet digital circuitry 206 of FIG. 2, it is alternatively possible that decoupling rows 110 may also be provided within digital circuitry 206 or alternatively only within high noise digital circuitry 210. In this regard, the disclosed circuitry and methods allow placement of decoupling rows for location of decoupling capacitance in any one or more areas of an IC where needed or desired to fit the noise and layout characteristics of a given application.

Following is an example of the relative surface area of decoupling capacitance that may be provided in one exemplary embodiment within digital circuitry of IC 200: digital circuitry areas 206, 209 and 210 may occupy a combined surface area of 1.86 mm$^2$ out of a total surface area of 4.58 mm$^2$ for IC 200, while decoupling rows 110 (each row 110 containing decoupling capacitors) may occupy a combined surface area of 0.19 mm$^2$ out of the total surface area of IC 200. It will be understood that these relative surface area values are exemplary only, and that they may vary to fit the characteristics of a given application. Moreover, it will be understood that the layout and particular combination of types of circuitry areas of FIG. 2 are exemplary only, and that layout and types of circuitry areas within a particular IC may vary. Moreover, the relative positioning of decoupling rows within circuitry may vary as needed or desired to fit the noise characteristics of the circuitry of a particular IC. Further, although not illustrated in FIG. 2, it will be understood that additional decoupling capacitance may be provided in the form of decoupling rows 110 and/or standard cell rows 102 located in edge areas 212. In one exemplary embodiment, lower area efficiency conventional decoupling capacitor cells (i.e., common CMOS decoupling capacitor cells containing both nWells and pWells) may be employed inside the standard cell rows 102 as spacers only in order to minimize the amount of area used by these relatively lower area efficiency capacitor cells by increasing the utilization.

FIG. 2 illustrates one exemplary embodiment in which multiple decoupling rows 110 are formed within the digital core 208 of an IC 200 between adjacent standard CMOS cell rows 102 (which include active digital circuitry) of core 208. Although such a multiple row configuration may be employed to maximize area efficiency, it will be understood that decoupling capacitors may be alternatively formed in a grid configuration within digital logic circuitry of a digital core. For example, if a specific digital circuitry region within a digital core 208 is found to have a noise level that requires a higher decoupling capacitive density than is achievable using a geometry of multiple decoupling rows 110 such as illustrated in FIG. 2, then a grid approach having decoupling capacitor cells arranged in columns that are oriented in perpendicular relationship to the standard cell rows may additionally or alternatively be used. For example, in one such alternative embodiment illustrated in FIG. 1B, each of the decoupling capacitor cell columns 111 may intersect the decoupling capacitor cell rows 110 to form a grid of intersecting decoupling capacitor cell rows 110 and decoupling capacitor cell columns 111, with the decoupling capacitor cell columns 111 being formed using the same single type well (e.g., single pWell or nWell) extending across the height of each of the decoupling columns 111 in a manner similar to the way in which a single type well extends across the height of the intersecting decoupling capacitor rows 110.

Figure 1B:
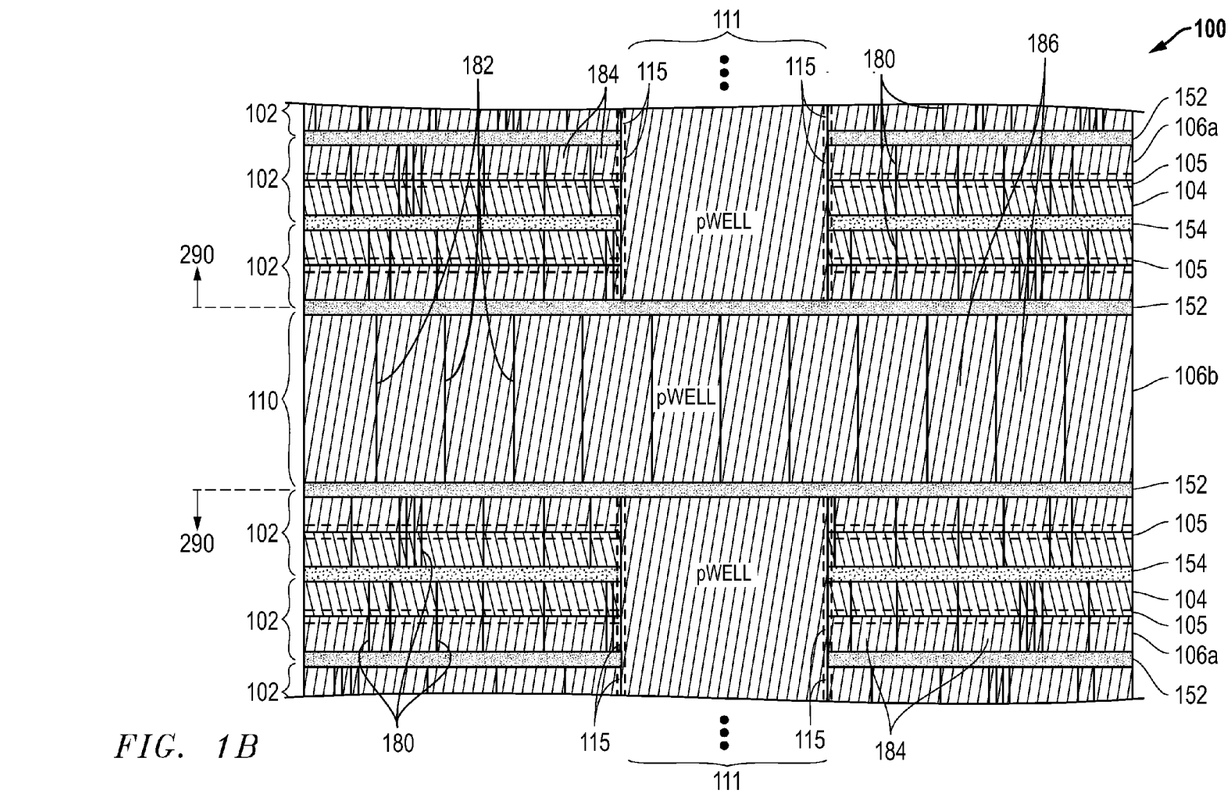
FIG. 1B illustrates an overhead view of a portion of an integrated circuit according to one exemplary embodiment of the disclosed circuits and methods.

For example, a decoupling capacitor cell column 111 may be formed from multiple relatively narrow width decoupling capacitor cell rows that are stacked in abutting relationship to each other and that also abut the wider decoupling capacitor cell row/s 110 as shown in FIG. 1B. As shown, such narrow decoupling capacitor cell rows of a decoupling capacitor cell column 111 may be formed to bisect standard cell rows 102 in areas between the wider decoupling capacitor cell rows 110. In this regard, the pair of three dots illustrated in FIG. 1B are present to show that the pattern of integrated circuit (IC) 100 may extend such that the pWell of a given decoupling capacitor cell column 111 may extend in opposite upward and downward vertical directions (relative to the page) to form a column of continuous pWell areas that are oriented in perpendicular relationship to the orientation of both the standard cell rows 102 and decoupling cell row/s 110. In one embodiment, such a decoupling capacitor cell column may extend between and intersect adjacent decoupling cell rows 110. It will be understood that as with decoupling cell rows 110, a decoupling capacitor cell column 111 may be alternatively formed using nWell areas in other embodiments having different polarity.

In one embodiment, an individual segment of a capacitor cell column 111 may be formed to extend between two non-adjacent negative supply rails 152 with all supply rails 152 or 154 that lie therebetween removed. For example, as shown in the embodiment of FIG. 1B, positive supply rails 154 may be cut and removed at the location of decoupling cell column 111 so that they do not extend across the segments of a decoupling column 111. In such a configuration, the severed or terminal ends of the positive supply rails 154 disposed on each side of a given decoupling column 111 may be connected together to bridge the gap, e.g., by an upper metal mesh layer (different layer) of the integrated circuit 100 to provide continuity. Similarly, one or more negative supply rails 152 may be cut and bridged in similar manner in those cases as illustrated in FIG. 1B where a capacitor cell column 111 is formed to have a height greater than two times the height of the standard cell rows 102, e.g., one negative supply rail 152 and two positive supply rails may be cut for a segment of a capacitor cell column 111 that has a height equal to four times the height of the standard cell rows 102, two negative supply rails 152 and three positive supply rails may be cut for a segment of a capacitor cell column 111 that has a height equal to six times the height of the standard cell rows 102, etc. In yet another embodiment, a segment of a capacitor cell column 111 may be formed between two adjacent and uncut negative supply rails 152 (with the intervening positive supply rail 154 being cut and bridged) so that the capacitor cell column 111 has a segment height that is equal to two times the height of standard cell rows 102.

However, it is also possible in some embodiments that, where present, decoupling capacitor columns 111 may require more than one well be used (e.g., at least for the frontier between the route and the decoupling), which in some cases may exhibit lower efficiency than a row configuration. Additionally, when only decoupling capacitor cell rows 110 present, substantially no area efficiency penalty may result due to any space wasted in the interface between standard cell rows 102 and decoupling capacitor cell rows 110. However, if a grid configuration is employed using capacitor cell columns, there may be a column of wasted space 115 (e.g., as required by appropriate minimum distance design rules) as illustrated in FIG. 1B where each decoupling cell column 111 abuts each standard cell row 102 which has both pWell and nWell.

Figure 3:
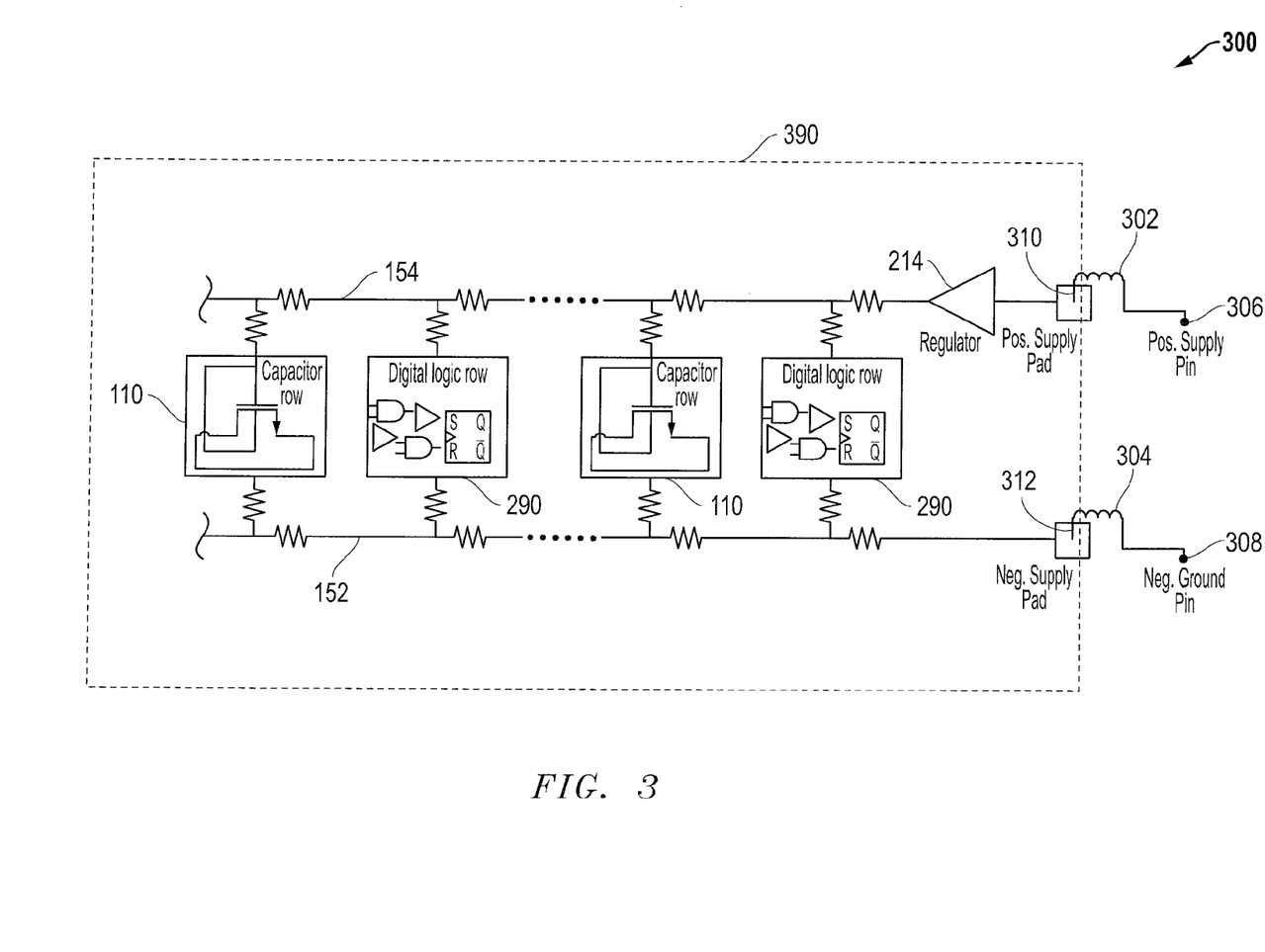
FIG. 3 illustrates a simplified circuit schematic of digital circuitry area according to one exemplary embodiment of the disclosed circuits and methods.

FIG. 3 illustrates a simplified circuit schematic of digital circuitry area 300 (e.g., such as digital circuitry area 209 or 210 of FIG. 2) of an IC 390 as it may be configured according to one exemplary embodiment. As shown in FIG. 3, circuitry area 300 includes decoupling capacitors formed in decoupling rows 110 that are placed in-between digital logic rows 290 which include active digital circuitry formed in standard cell rows 102 of IC 200 as previously described in relation to FIGS. 1 and 2. As shown, each of capacitors of decoupling capacitor rows 110 and active digital circuitry of digital logic rows 290 are coupled between positive supply rail 154 and negative supply rail 152 of IC 200. Also illustrated in FIG. 3 are positive supply pad 310 and negative supply pad 312 of IC 390 that are coupled to corresponding positive supply pin 306 and negative supply pin 308 by connectors 302 and 304, e.g., lead frame connection wires. Regulator circuitry 214 is also shown coupled in the current path between supply pad 310 and positive voltage rail 154.

Figure 4:
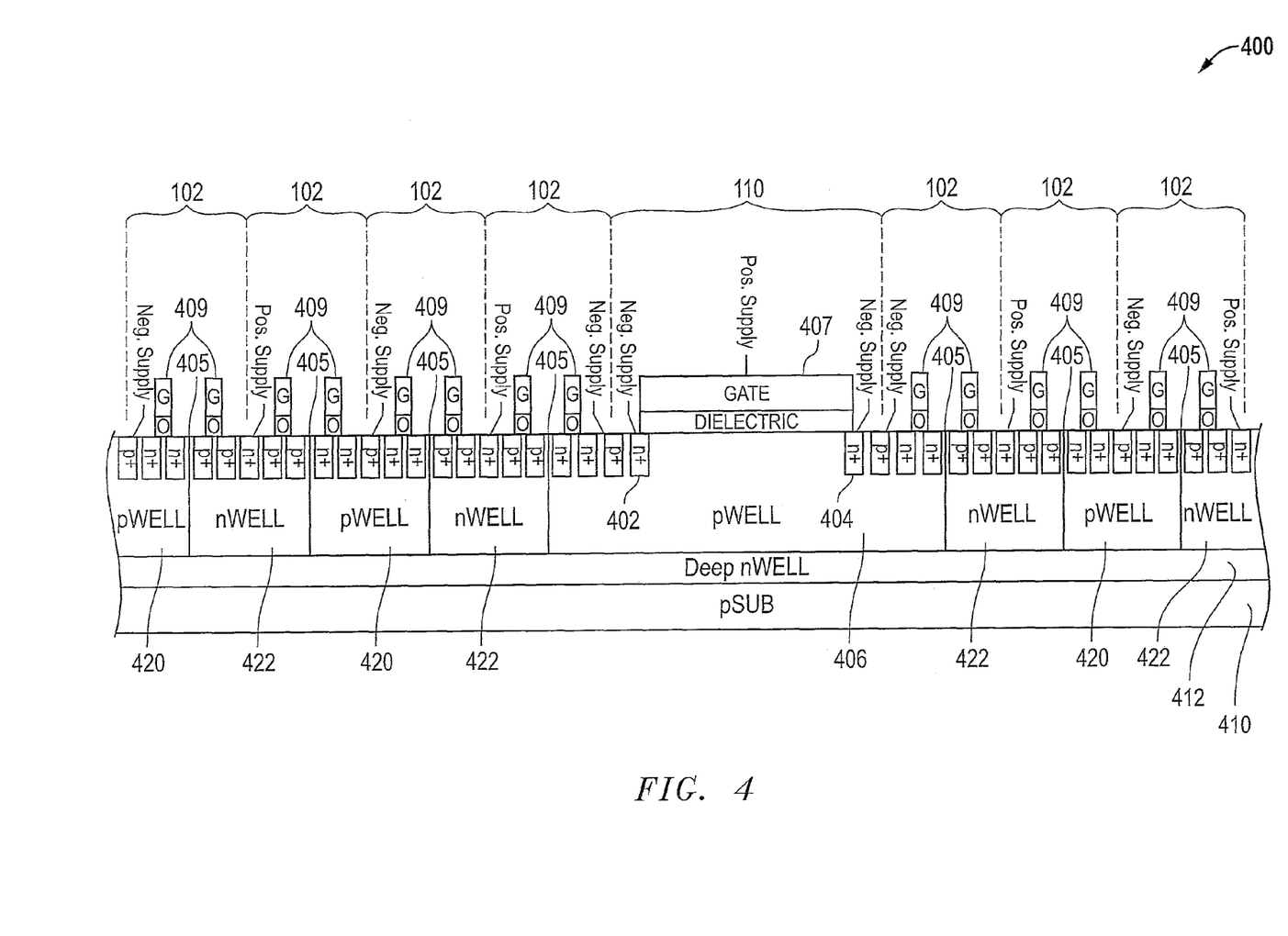
FIG. 4 illustrates a partial cross-sectional view of a decoupling capacitor structure according to one exemplary embodiment of the disclosed circuits and methods.

FIG. 4 illustrates a partial cross-sectional view of an integrated circuit 400 having a NMOS decoupling capacitor structure 407 formed on a silicon substrate 410 according to one exemplary embodiment. In this embodiment, integrated circuit 400 includes a deep nWell 412 formed within a p-type substrate 410 and having a single pWell 406 formed thereon that extends across a decoupling row 110, e.g., within digital logic circuitry of a digital core 208. Also shown in FIG. 4 are N+ source and drain areas 402 and 404 formed within single pWell 406. Decoupling capacitor structure 407 may in one embodiment extend across substantially the entire height of decoupling row 110. As previously described, the polarity of the well used for a decoupling row 110 may be reversed, e.g., in an alternative embodiment a PMOS decoupling capacitor structure may be formed to include P+ source and drain areas formed in a single nWell that extends across a decoupling row 110.

Figure 5:
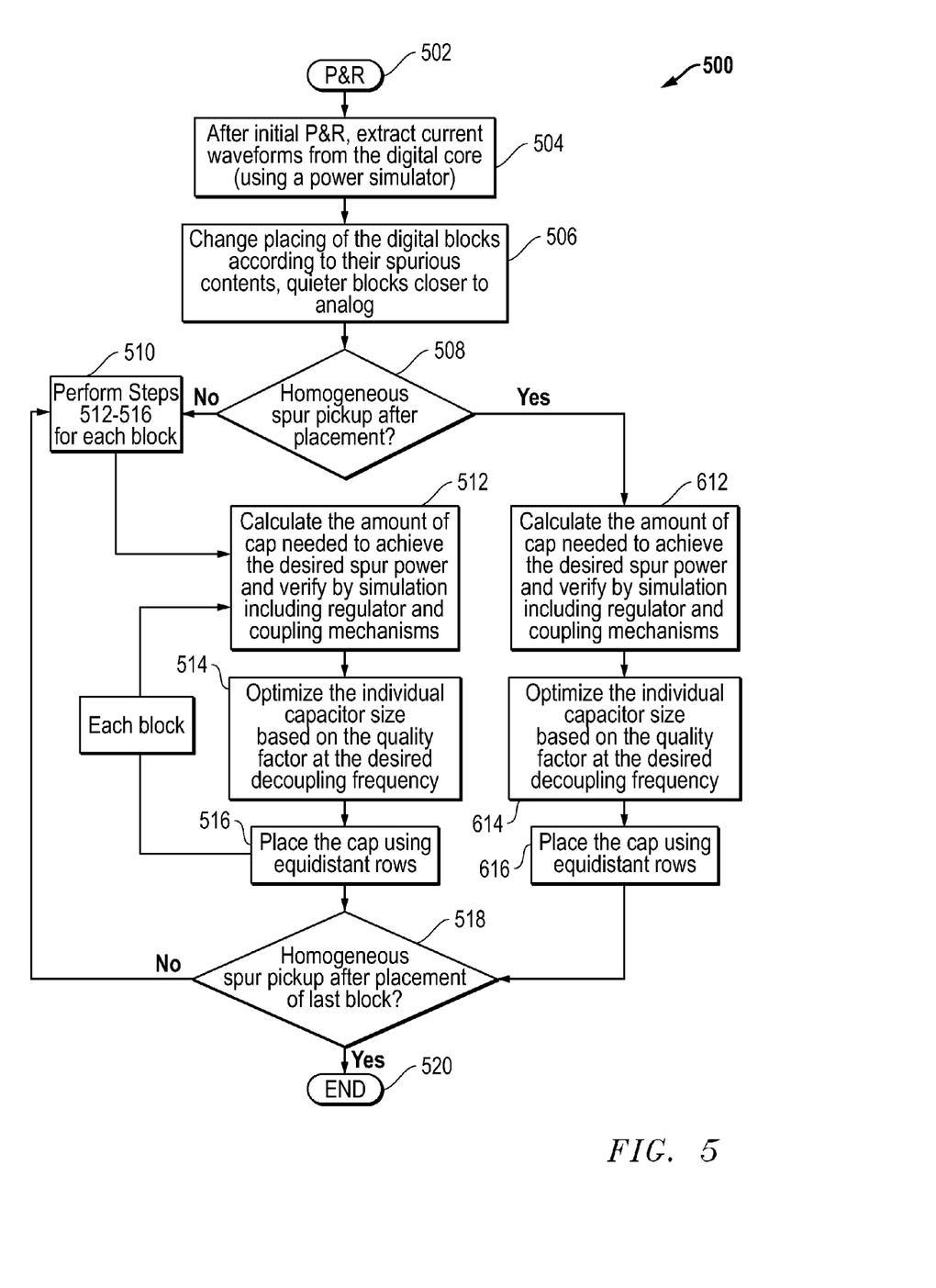
FIG. 5 illustrates one exemplary embodiment of methodology according to one exemplary embodiment of the disclosed circuits and methods.

FIG. 5 illustrates one exemplary embodiment of methodology 500 for decoupling capacitor selection and placement. Methodology 500 begins in step 502 with initial circuit placement and routing (P&R) for an IC 200 having analog circuitry and a digital core 208 with no decoupling capacitors yet placed. Methodology 500 then proceeds to step 504 in which current waveforms are extracted from the digital core (e.g., using a power simulator). Determination of the waveforms may be performed in one exemplary embodiment, for example, by either doing an hierarchical analysis or by powering up/down different digital blocks during simulation to determine the independent contributions. To determine the spurious content, digital blocks with backannotated parasitics may be simulated and the current waveform may be extracted from those simulations.

Next in step 506, placement of the digital areas or blocks (e.g., subdivisions of digital logic active circuitry areas 209 and 210 of FIG. 2) may be changed for the IC according to spurious content based on results of step 504. In this regard, in one embodiment noisier digital blocks or areas may be placed farthest from the most noise sensitive analog circuit areas of the IC, e.g., in the manner illustrated and described in relation to FIG. 2 herein. For example, the quietest (least noisy) digital blocks may be placed between the analog circuitry of the IC 200 and the noisier digital circuitry of the IC 200, with the most noise sensitive analog circuitry of the IC 200 being placed farthest from the noisiest digital circuitry of the digital core.

Next, current waveforms may be again extracted in step 508 to determine if spurious content of the digital blocks/areas of the IC 200 are substantially homogenous across the digital core after the placement changes made in step 506. In this regard, the current data from different blocks may be analyzed to determine if all blocks have the substantially the same spurious contribution making the spurious contributions substantially homogeneous. If not, then methodology 500 enters a block-by-block mode in step 510, in which each of steps 512 to 514 are repeated for each given block of the digital core 208 before proceeding to step 518. In this regard, for each given digital block the amount of decoupling capacitance may be calculated in step 512 that is needed to achieve the desired spur content for each block (e.g., to achieve a homogenous spur pickup), and this calculation then verified by simulation including regulator and coupling mechanisms. Next, in step 514, the individual capacitor size may be optimized for the given block (e.g., based on the quality factor for an individual decoupling capacitor at the desired decoupling frequency). After step 514, then equidistant decoupling rows 110 of decoupling capacitors may be placed for the given digital block in step 516. After steps 512 to 516 have been performed for all digital blocks, then methodology 500 may proceed to step 518, where the current waveforms across the digital core 208 may be extracted in step 518 to determine if homogeneous spur pickup across digital core 208 has been achieved. If so, then methodology 500 terminates in step 520. If not, then methodology 500 returns to step 510 and steps 512 to 516 repeated for each digital block before returning to step 518. It is noted that performance of block-by-block steps 512-516 may yield digital blocks that have different spacing of decoupling rows 110 from each other.

If in step 508 it is determined that the spurious content of the digital blocks/areas of the IC 200 are substantially homogenous across the digital core after the placement changes made in step 506, then methodology proceeds to steps 612, 614 and 616 in which methodology similar to corresponding steps 152, 514 and 516 is repeated on for the digital core 208 as a whole rather than on a block-by-block basis. After steps 612, 614 and 616 are performed, then step 518 is performed to determine if homogeneous spur pickup across digital core 208 has been achieved. If so, then methodology 500 terminates in step 520, and steps 612-616 may yield a digital core 208 having consistent spacing of decoupling rows 110. However, if not, then methodology 500 proceeds to step 510 and steps 512 to 516 performed for each digital block as previously described. It will be understood that FIG. 5 is exemplary only, and that any suitable combination of additional, alternative or fewer steps may be employed for decoupling capacitor configuration and placement according to the circuits and methods described herein.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. An integrated circuit device, comprising:
a silicon substrate;
analog circuitry formed on the silicon substrate;
a digital core formed on the silicon substrate separate from the analog circuitry, the digital core including at least one area of active digital circuitry;
one or more decoupling cell rows formed on the silicon substrate within the at least one area of active digital circuitry, each of the one or more decoupling cell rows including at least one p-type doped well or n-type doped well;
one or more metal-oxide-semiconductor (MOS) decoupling capacitors formed within the at least one p-type doped well or n-type doped well of each of the one or more decoupling cell rows;
multiple standard cell rows formed on the silicon substrate within the digital core and oriented in a parallel relationship to the one or more decoupling cell rows such that one or more of the decoupling cell rows are disposed between adjacent rows of the multiple standard cell rows, each of the multiple standard cell rows including a p-type doped well and an n-type doped well; and
where the at least one p-type doped well or n-type doped well of each of the one or more decoupling cell rows extends across an entire height of the decoupling cell row and into each of the adjacent row of the multiple standard cell rows such that the p-type doped well or n-type doped well of the decoupling cell row also forms the p-type doped well or n-type doped well of each of the adjacent standard cell rows.

2. The integrated circuit device of claim 1, where each of the p-type doped well and the n-type doped well of each of the multiple standard cell rows extends the length of the standard cell row; where active digital circuitry is formed by MOS circuit devices in each of the p-type doped well and n-type doped well of the standard cell row, the MOS circuit devices in the p-type doped well of each of the multiple standard cell rows being spaced apart from the MOS circuit devices in the n-type doped well of the same standard cell row; and where each given one of the one or more decoupling cell rows is disposed next to and between two wells of opposite polarity to the p-type doped well or the n-type doped well of the given decoupling cell row.

3. The integrated circuit device of claim 2, where each of the multiple standard cell rows has a height, the height being the same for each of the multiple standard cell rows; where the height of each of the one or more decoupling cell rows is taller than the height of each of the multiple standard cell rows; and where the height of each of the one or more decoupling cell rows is an even multiple of the height of the standard cell rows.

4. The integrated circuit device of claim 2, further comprising:
  alternating positive and negative supply rails oriented parallel to and overlying each of the standard cell rows, each of the standard cell rows being defined between one of the positive supply rails and an adjacent corresponding one of the negative supply rails; and
  either of two adjacent positive supply rails or two adjacent negative supply rails oriented parallel to and overlying each of the decoupling cell rows, each of the decoupling cell rows being defined between either two of the adjacent negative supply rails or two of the adjacent positive supply rails; and
  where at least one of:
    each of the one or more decoupling capacitors defined between two adjacent negative supply rails is coupled between a positive supply rail of the integrated circuit device and at least one negative supply rail of the two adjacent negative supply rails, or
    each of the one or more decoupling capacitors defined between two adjacent positive supply rails is coupled between a negative supply rail of the integrated circuit device and at least one positive supply rail of the two adjacent positive supply rails.

5. The integrated circuit device of claim 4, where each pair of the alternating positive and negative supply rails are separated by the same distance; where the two adjacent positive supply rails or two adjacent negative supply rails of each of the decoupling cell rows are separated by a distance that is larger than the distance separating the alternating positive and negative supply rails and that is an even multiple of the distance separating the alternating positive and negative supply rails.

6. The integrated circuit device of claim 1, where the digital core includes alternating rows of p-type doped wells and n-type doped wells, the active digital circuitry being formed in the p-type doped wells and n-type doped wells of the digital core; and where each of the one or more decoupling cell rows includes either one of:
  an n-type doped well disposed next to and between two p-type doped wells of the digital core, or
  a p-type doped well disposed next to and between two n-type doped wells of the digital core.

7. The integrated circuit device of claim 6, further comprising alternating positive and negative supply rails, a positive supply rail oriented parallel to and overlying each of the n-type doped wells of the standard cell rows of the digital core and a negative supply rail oriented parallel to and overlying each of the p-type doped wells of the standard cell rows of the digital core; and
  at least one of the following:
    where one or more of the decoupling cell rows comprises an n-type doped well disposed next to and between two p-type doped wells of the digital core, and the integrated circuit further comprises a pair of adjacent positive supply rails oriented parallel to and overlying the n-typed doped well of the decoupling cell row with one or more MOS decoupling capacitors formed in the n-type doped well of each of the decoupling cell rows between the pair of adjacent positive supply rails, or
    where one or more of the decoupling cell rows comprises a p-type doped well disposed next to and between two n-type doped wells of the digital core, and the integrated circuit further comprises a pair of adjacent negative supply rails oriented parallel to and overlying the n-typed doped well of the decoupling cell row with one or more MOS decoupling capacitors formed in the p-type doped well of each of the decoupling cell rows between the pair of adjacent negative supply rails; and
  where at least one of:
    where each of the one or more decoupling capacitors defined between two adjacent negative supply rails is coupled between a positive supply rail of the integrated circuitry and at least one negative supply rail of the pair of adjacent negative supply rails, or
    where each of the one or more decoupling capacitors defined between two adjacent positive supply rails is coupled between a negative supply rail of the integrated circuitry and at least one positive supply rail of the pair of adjacent positive supply rails.

8. The integrated circuit device of claim 1, where at least a first portion of the one or more decoupling cell rows are disposed in a multiple adjacent and abutting relationship to form one or more decoupling cell columns that bisect at least a portion of the standard cell rows on the silicon substrate within the at least one area of active digital circuitry, the one or more decoupling cell columns being oriented in a perpendicular relationship to the standard cell rows.

9. The integrated circuit device of claim 8, where one or more of the individual rows of a second portion of decoupling cell rows define a decoupling cell grid on the silicon substrate within the at least one area of active digital circuitry, the one or more decoupling cell columns including only one of a p-type doped well or an n-type doped well extending across an entire height of each decoupling cell column and that is of the same polarity as the p-type doped well or an n-type doped well of the second portion of decoupling cell rows.

10. The integrated circuit device of claim 1, where the at least one area of active digital circuitry of the digital core comprises multiple areas of active digital circuitry within an outer boundary of the digital core, each of the active digital circuitry areas including active digital circuitry and decoupling cell rows formed therein; where the active digital circuitry of each of the active digital circuitry areas would produce a different amount of spurious noise content during circuit operation without the presence of the decoupling cell rows formed therein; and where a spacing of the decoupling cell rows is closer together in those active digital circuitry areas that would produce a relatively greater amount of spurious noise content without the presence of the decoupling cell rows formed therein than is a spacing of the decoupling cell rows in those active digital circuitry areas that would produce a relatively lesser amount of spurious noise content without the presence of the decoupling cell rows formed therein so as to achieve a greater decoupling capacitor density within those active digital circuitry areas that would produce a relatively greater amount of spurious noise content without the presence of the decoupling cell rows formed therein than a decoupling capacitor density within those active digital circuitry areas that would produce a relatively lesser amount of spurious noise content without the presence of the decoupling cell rows formed therein.

11. An integrated circuit device, comprising:
a silicon substrate;
analog circuitry formed on the silicon substrate;
a digital core formed on the silicon substrate separate from the analog circuitry, the digital core including at least one area of active digital circuitry;
one or more decoupling cell rows formed on the silicon substrate within the at least one area of active digital circuitry, each of the one or more decoupling cell rows including at least one p-type doped well or n-type doped well extending across an entire height of the decoupling cell row; and
one or more metal-oxide-semiconductor (MOS) decoupling capacitors formed within the at least one p-type doped well or n-type doped well of each of the decoupling cell rows;
where the at least one area of active digital circuitry of the digital core comprises multiple areas of active digital circuitry within an outer boundary of the digital core, each of the active digital circuitry areas including active digital circuitry and decoupling cell rows formed therein; where the active digital circuitry of each of the active digital circuitry areas has a different current density during circuit operation; and where a spacing of the decoupling cell rows in the active digital circuitry areas varies across the digital core such that a spurious noise content is substantially homogenous across the digital core during circuit operation.

12. An integrated circuit device, comprising:
a silicon substrate;
analog circuitry formed on the silicon substrate;
a digital core formed on the silicon substrate separate from the analog circuitry, the digital core including at least one area of active digital circuitry;
one or more decoupling cell rows formed on the silicon substrate within the at least one area of active digital circuitry, each of the one or more decoupling cell rows including at least one p-type doped well or n-type doped well extending across an entire height of the decoupling cell row; and
one or more metal-oxide-semiconductor (MOS) decoupling capacitors formed within the at least one p-type doped well or n-type doped well of each of the decoupling cell rows;
where the at least one area of active digital circuitry of the digital core comprises multiple areas of active digital circuitry within an outer boundary of the digital core, each of the active digital circuitry areas including decoupling cell rows formed therein; where each of the active digital circuitry areas produces a different amount of spurious noise content during circuit operation; and where the active digital circuitry areas that produce a relatively greatest amount of spurious noise content during circuit operation are placed within the digital core such that the active digital circuitry areas that produce the relatively greatest amount of spurious noise content during circuit operation are positioned at a greater distance from the analog circuitry than the digital circuitry areas that produce a relatively lesser amount of spurious noise content during circuit operation.

13. A method for configuring an integrated circuit device, comprising:
providing a silicon substrate;
forming analog circuitry on the silicon substrate;
forming a digital core on the silicon substrate separate from the analog circuitry, the digital core including at least one area of active digital circuitry;
forming one or more decoupling cell rows on the silicon substrate within the at least one area of active digital circuitry, each of the one or more decoupling cell rows including only one of a p-type doped well or an n-type doped well; and
forming one or more metal-oxide-semiconductor (MOS) decoupling capacitors in the p-type doped well or n-type doped well of each of the one or more decoupling cell rows;
forming standard cell rows on the silicon substrate within the digital core and oriented in a parallel relationship to the one or more decoupling cell rows such that one or more of the decoupling cell rows are disposed between adjacent rows of the multiple standard cell rows, each of the multiple standard cell rows including a p-type doped well and an n-type doped well; and
forming the at least one p-type doped well or n-type doped well of each of the one or more decoupling cell rows to extend across an entire height of the decoupling cell row and into each of the adjacent row of the multiple standard cell rows such that the p-type doped well or n-type doped well of the decoupling cell row also forms the p-type doped well or n-type doped well of each of the adjacent standard cell rows.

14. The method of claim 13, further comprising forming the multiple standard cell rows on the silicon substrate such that each of the p-type doped well and the n-type doped well of each of the multiple standard cell rows extends the length of the standard cell row; forming the active digital circuitry as MOS circuit devices in each of the p-type doped well and n-type doped well of each standard cell row such that the MOS circuit devices in the p-type doped well of each of the multiple standard cell rows is spaced apart from the MOS circuit devices in the n-type doped well of the same standard cell row; and where each of the one or more decoupling cell rows is disposed next to and between two wells of opposite polarity to the p-type doped well or the n-type doped well of the decoupling cell row.

15. The method of claim 14, further comprising:
forming alternating positive and negative supply rails oriented parallel to and overlying each of the standard cell rows, each of the standard cell rows being defined between one of the positive supply rails and an adjacent corresponding one of the negative supply rails;
forming either of two adjacent positive supply rails or two adjacent negative supply rails oriented parallel to and overlying each of the decoupling cell rows, each of the decoupling cell rows being defined between either two of the adjacent negative supply rails or two of the adjacent positive supply rails; and
at least one of:
forming each of the one or more decoupling capacitors to be defined between two adjacent negative supply rails and to be coupled between a positive supply rail of the integrated circuit device and at least one negative supply rail of the pair of adjacent negative supply rails, or forming each of the one or more decoupling capacitors to be defined between two adjacent positive supply rails and to be coupled between a negative supply rail of the integrated circuit device and at least one positive supply rail of the pair of adjacent positive supply rails.

16. The method of claim 13, further comprising forming the digital core to include alternating rows of p-type doped wells and n-type doped wells, the active digital circuitry being formed in the p-type doped wells and n-type doped wells of the digital core; and forming each of the one or more decoupling cell rows to include either one of:
  an n-type doped well disposed next to and between two p-type doped wells of the digital core, or
  a p-type doped well disposed next to and between two n-type doped wells of the digital core.

17. The method of claim 16, further comprising forming alternating positive and negative supply rails such that a positive supply rail is oriented parallel to and overlies each of the n-type doped wells of the standard cell rows of the digital core and such that a negative supply rail is oriented parallel to and overlies each of the p-type doped wells of the standard cell rows of the digital core; and
  at least one of the following:
    forming one or more of the decoupling cell rows to comprise an n-type doped well disposed next to and between two p-type doped wells of the digital core, and forming a pair of adjacent positive supply rails oriented parallel to and overlying the n-typed doped well of the decoupling cell row with one or more MOS decoupling capacitors formed in the n-type doped well of the decoupling cell row between the pair of adjacent positive supply rails, and coupling each of the one or more MOS decoupling capacitors between a negative supply rail of the integrated circuit device and at least one positive supply rail of the pair of adjacent positive supply rails, or
    forming one or more of the decoupling cell rows to comprise a p-type doped well disposed next to and between two n-type doped wells of the digital core, and forming a pair of adjacent negative supply rails oriented parallel to and overlying the n-typed doped well of the decoupling cell row with one or more MOS decoupling capacitors formed in the p-type doped well of the decoupling cell row between the pair of adjacent negative supply rails, and coupling each of the one or more MOS decoupling capacitors between a positive supply rail of the integrated circuit device and at least one negative supply rail of the pair of adjacent negative supply rails.

18. The method of claim 13, further comprising forming at least a first portion of the each of the one or more decoupling cell rows disposed in a multiple adjacent and abutting relationship to create one or more decoupling cell columns that bisect at least a portion of the standard cell rows on the silicon substrate within the at least one area of active digital circuitry, the one or more decoupling cell columns being oriented in a perpendicular relationship to the standard cell rows.

19. The method of claim 18, further comprising forming one or more of the individual rows of a second portion of decoupling cell rows to define a decoupling cell grid on the silicon substrate within the at least one area of active digital circuitry, the one or more decoupling cell columns including only one of a p-type doped well or an n-type doped well extending across an entire height of each decoupling cell column and that is of the same polarity as the p-type doped well or an n-type doped well of the second portion of decoupling cell rows.

20. The method of claim 13, further comprising forming the digital core such that the at least one area of active digital circuitry of the digital core comprises multiple areas of active digital circuitry within an outer boundary of the digital core, each of the active digital circuitry areas including active digital circuitry and decoupling cell rows formed therein; where the active digital circuitry of each of the active digital circuitry areas would produce a different amount of spurious noise content during circuit operation without the presence of the decoupling cell rows formed therein; and where the method further comprises spacing closer together the decoupling cell rows formed in those active digital circuitry areas that would produce a relatively greater amount of spurious noise content without the presence of the decoupling cell rows formed therein than spacing the decoupling cell rows formed in those active digital circuitry areas that would produce a relatively lesser amount of spurious noise content without the presence of the decoupling cell rows formed therein so as to achieve a greater decoupling capacitor density within those active digital circuitry areas that would produce a relatively greater amount of spurious noise content without the presence of the decoupling cell rows formed therein than a decoupling capacitor density within those active digital circuitry areas that would produce a relatively lesser amount of spurious noise content without the presence of the decoupling cell rows formed therein.

21. A method for configuring an integrated circuit device, comprising:
  providing a silicon substrate;
  forming analog circuitry on the silicon substrate;
  forming a digital core on the silicon substrate separate from the analog circuitry, the digital core including at least one area of active digital circuitry;
  forming one or more decoupling cell rows on the silicon substrate within the at least one area of active digital circuitry, each of the one or more decoupling cell rows including only one of a p-type doped well or an n-type doped well extending across an entire height of the decoupling cell row;
  forming one or more metal-oxide-semiconductor (MOS) decoupling capacitors in the p-type doped well or n-type doped well of each of the decoupling cell rows; and
  forming the digital core such that the at least one area of active digital circuitry of the digital core comprises multiple areas of active digital circuitry within an outer boundary of the digital core, each of the active digital circuitry areas including active digital circuitry and decoupling cell rows formed therein; where each of the active digital circuitry areas has a different current density during circuit operation; and where the method further comprises varying a spacing the decoupling cell rows formed in the active digital circuitry areas across the digital core such that a spurious noise content is substantially homogenous across the digital core during circuit operation.

22. A method for configuring an integrated circuit device, comprising:
  providing a silicon substrate;
  forming analog circuitry on the silicon substrate;
  forming a digital core on the silicon substrate separate from the analog circuitry, the digital core including at least one area of active digital circuitry;
  forming one or more decoupling cell rows on the silicon substrate within the at least one area of active digital circuitry, each of the one or more decoupling cell rows including only one of a p-type doped well or an n-type doped well extending across an entire height of the decoupling cell row;

forming one or more metal-oxide-semiconductor (MOS) decoupling capacitors in the p-type doped well or n-type doped well of each of the decoupling cell rows; and forming the digital core such that the at least one area of active digital circuitry of the digital core comprises multiple areas of active digital circuitry within an outer boundary of the digital core, each of the active digital circuitry areas including decoupling cell rows formed therein; where each of the active digital circuitry areas produces a different amount of spurious noise content during circuit operation; and where the method further comprises placing the active digital circuitry areas that produce a relatively greatest amount of spurious noise content during circuit operation within the digital core such that the active digital circuitry areas that produce the relatively greatest amount of spurious noise content during circuit operation are positioned at a greater distance from the analog circuitry than the digital circuitry areas that produce a relatively lesser amount of spurious noise content during circuit operation.

* * * * *